US005496746A

United States Patent [19]

Matthews

[11] Patent Number: 5,496,746
[45] Date of Patent: Mar. 5, 1996

[54] METHOD FOR FABRICATING A BIPOLAR JUNCTION TRANSISTOR EXHIBITING IMPROVED BETA AND PUNCH-THROUGH CHARACTERISTICS

[75] Inventor: James A. Matthews, Milpitas, Calif.

[73] Assignee: Microsystems Engineering, Inc., Calif.

[21] Appl. No.: 378,352

[22] Filed: Jan. 25, 1995

Related U.S. Application Data

[62] Division of Ser. No. 114,980, Aug. 31, 1993, Pat. No. 5,386,140, which is a continuation of Ser. No. 780,640, Oct. 23, 1991, abandoned.

[51] Int. Cl.$^6$ .............................................. H01L 21/8222
[52] U.S. Cl. ............................ 437/31; 437/27; 437/154; 437/909; 148/DIG. 10
[58] Field of Search .................................. 437/31, 32, 27, 437/150, 152, 154, 909, 917; 148/DIG. 10

[56] References Cited

U.S. PATENT DOCUMENTS

| | | | |
|---|---|---|---|
| 4,996,581 | 2/1991 | Hamasaki | 437/31 |
| 5,140,400 | 8/1992 | Morishita | 257/592 |
| 5,183,768 | 2/1993 | Kameyama et al. | 437/31 |
| 5,185,276 | 2/1993 | Chen et al. | 437/31 |
| 5,198,373 | 3/1993 | Yoshino | 437/31 |
| 5,217,909 | 6/1993 | Bertagnolli | 437/31 |
| 5,320,972 | 6/1994 | Wylie | 437/31 |
| 5,336,926 | 8/1994 | Mathews | 437/31 |

Primary Examiner—Brian E. Hearn
Assistant Examiner—Tuan Nguyen
Attorney, Agent, or Firm—Burns, Doane, Swecker & Mathis

[57] ABSTRACT

A bipolar transistor having an emitter, a base, and a collector includes an intrinsic base region having narrow side areas and a wider central area. The side areas are located adjacent to the extrinsic base region, while the central area is disposed underneath the emitter. The lateral doping profile of the base is tailored so that the doping concentrations in the extrinsic region and the central area are relatively high compared to the doping concentration of the narrow side areas of the intrinsic base. The combination of the narrow side areas and the lateral base doping profile constrains the depletion region within the base thereby lowering punch-through voltage of the transistor without loss of beta.

12 Claims, 5 Drawing Sheets

FIG_3A
1-DIMENSIONAL THEORY

FIG_3B
2-DIMENSIONAL THEORY

FIG_3C
2-DIMENSIONAL THEORY

FIG_4A (PRIOR ART)

FIG_4B

FIG_4C (PRIOR ART)

FIG_5A

FIG_5B

FIG_5C

FIG_6A

FIG_6B

FIG_6C

FIG_6D

METHOD FOR FABRICATING A BIPOLAR JUNCTION TRANSISTOR EXHIBITING IMPROVED BETA AND PUNCH-THROUGH CHARACTERISTICS

This application is a divisional, of application No. 08/114,980, filed Aug. 31, 1993, now U.S. Pat. No. 5,386,140, which is a continuation of application No. 07/780,640, filed Oct. 23, 1991 now abandoned.

FIELD OF THE INVENTION

The pesent invention relates to the field of bipolar junction transistor device structures.

BACKGROUND OF THE INVENTION

Modern high speed bipolar junction transistors (BJTs) are generally constrained by the competing concerns of high beta (i.e., forward current gain) and high base punch-through resistance.

Punch-through refers to the effect wherein the neutral base width is reduced to zero at a sufficiently high collector-base voltage, $V_{cb}$. With thee neutral base reduced to zero, the collector-base depletion region is in direct contact with the emitter-base depletion region. At this point, the collector is effectively short-circuited to the emitter, and a large current flows.

The effects of beta and punch-through voltage are both coupled directly through the base charge, $Q_b$. The total charge in the base region of a bipolar transistor is given by the product of the doping concentration, $N_A$, and the base width, $W_b$. Lowering $Q_b$ raises beta but also lowers punch-through voltage at the same time. For the opposite condition, raising $Q_b$ lowers the beta that resulting in a higher punch-through voltage. The trade-off between high beta and high punch-through resistance has been a fundamental feature of silicon bipolar junction transistors for many years.

In the past, researchers have attempted to decouple the competing effects of beta and punch-through voltage by altering the band gap characteristics of the emitter, the base, or both. Lowering the band gap at the base, for instance, by the use of silicon germanium (SiGe) alloys has produced favorable beta values with acceptable punch-through voltages. Alternatively, experiments in utilizing silicon carbide (SIC) alloys to raise the band gap of the emitter region have also produced favorable results. Considerable work is being done today in the technical community to further increase the performance of these "band gap engineered" structures.

While efforts to engineer the band gap of the emitters and base regions have produced impressive results, these results have not come without certain costs. One of the primary drawbacks of using alloy semiconductors such as silicon germanium or silicon carbide is that forming such alloys generally require the use of exotic processing equipment. Typically, heterojunction epitaxial layers are grown using a technique known as molecular beam epitaxy (MBE). In this method the substrate is held in a high vacuum while molecular or atomic beams of the constituent atoms impinge upon its surface.

The main problem with MBE machines, however, is that they are characterized by extremely slow growth rates (approximately 1 micron/hr.) and are very expensive and very difficult to operate in a manufacturing environment. Moreover, techniques such as MBE for forming heterojunction alloys are generally not compatible with modern processing requirements and structures, (e.g., BiCMOS processes). In light of these limitations, advanced epitaxial growth techniques like MBE have been limited to research facilities or to specific applications (e.g., microwave amplification devices) where the level of integration is severely limited and the manufacturing volumes are likewise small. Thus, the goal of simultaneously achieving high beta and high punch-through voltage in a bipolar transistor manufactured using conventional silicon processing equipment and techniques has not yet been accomplished.

As will be seen, the present invention provides a solution to the problem of achieving high beta and simultaneously high punch-through voltage in a homojunction bipolar device. Furthermore, according to the present invention, the novel device structure is easily fabricated using standard silicon processing equipment and lithographic techniques. Moreover, the invention is well-suited to a large volume, high production semiconductor manufacturing environment.

SUMMARY OF THE INVENTION

A homojunction bipolar transistor comprising emitter, base and collector regions is described. In one embodiment, the base region includes an extrinsic region disposed laterally about the emitter, and an intrinsic region which vertically separates the emitter from the collector. The intrinsic region further includes a side area adjacent to the extrinsic region, and a central area disposed generally beneath the emitter. Importantly, the lateral doping profile of the base is tailored so that the doping concentrations in the extrinsic region and the central area are relatively high compared to the doping concentration of the side area of the intrinsic base.

In accordance with the present invention, the side areas are purposefully made narrow such that the lateral doping profile across the base constrains the depletion region formed within the side areas. Reducing the extension of the collector depletion region into the base has the salutary effect of raising the punch-through voltage of the transistor without adversely affecting beta.

BRIEF DESCRIPTION OF THE DRAWINGS

The present invention is illustrated by way of example and not limitation in the figures of the accompanying drawings, in which like references indicate similar elements, and wherein.

DETAILED DESCRIPTION

In the following description, a novel bipolar junction transistor device structure is disclosed wherein numerous specific details are set forth, such as specific doping levels, processing steps, dimensions, etc., in order to provide a thorough understanding of the present invention. It will obvious, however, to one skilled in the art that these specific details may not be used to practice the present invention. In other instances, well known structures and processing techniques have not been shown in detail in order to avoid unnecessarily obscuring the present invention.

Figure 1A:
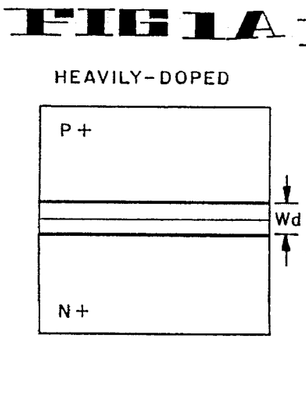
FIG. 1 illustrates a depletion layer width as a function of doping for a simple one-dimensional theory.
Figure 1B:
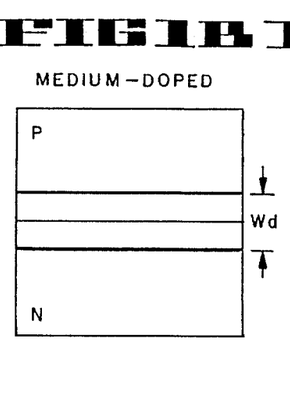
Figure 1C:
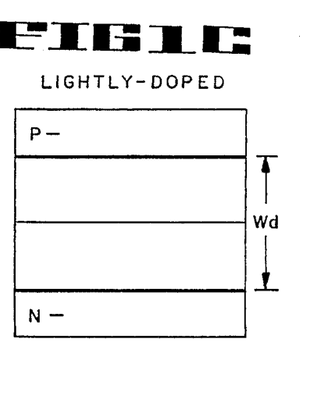

In order to better understand the mechanism of the present invention, a brief discussion of basic semiconductor physics is helpful. Referring to FIG. 1, the effect of doping concentration on the width of a depletion region, $W_d$, formed on either side of a PN junction is shown. FIG. 1 illustrates a heavily-doped junction having p+ and n+ regions, a medium-doped junction, and a lightly-doped junction having p– and n– materials. As is clearly seen, the width $W_d$ increases with decreasing doping.

Figure 2A:
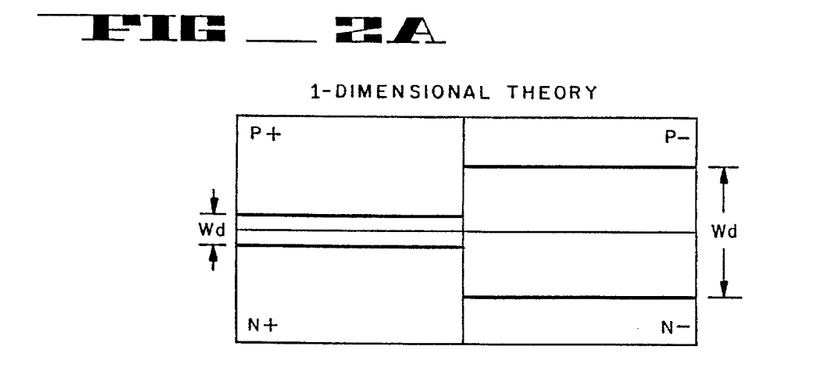
FIG. 2A illustrates the expected result according to a one-dimensional theory conjoining a heavily doped sample with a lightly doped semiconductor sample.
Figure 2B:
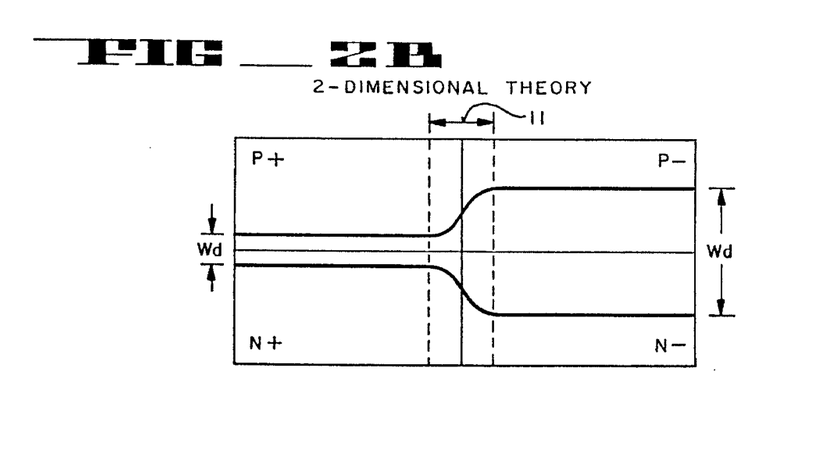
FIG. 2B illustrates the actual result achieved and predicted by a two-dimensional theory conjoining a lightly doped and more heavily doped semiconductor materials.

FIG. 2A illustrates the effect of joining a heavily-doped sample to a lightly-doped sample according to simple, one-dimensional semiconductor theory. One-dimensional transistor theory has been used in the past to predict the general behavior of standard bipolar transistors. Note that the one-dimensional physical theory predicts a discontinuity in the depletion layer width at the junction between the two differently doped material. A more accurate, two-dimensional theory is needed to accurately predict the shape of the depletion layer width in the narrow interface region between the two differently doped samples. In FIG. 2B, the actual junction between the lightly-doped and heavily-doped materials is shown by a finite transition region 11.

Figure 3A:
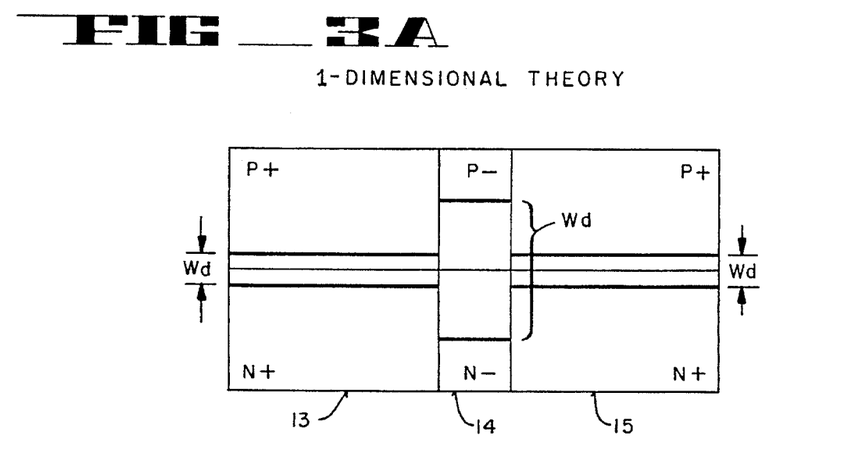
FIG. 3A illustrates a thin, lightly doped PN junction sandwiched between two heavily doped PN junctions for simply one-dimensional theory.
Figure 3B:
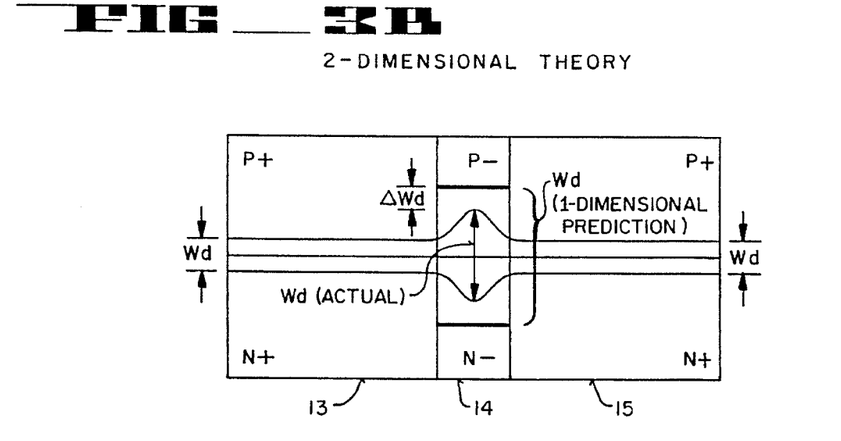
FIG. 3B illustrates the result predicted for the structure FIG. 3A under a two-dimensional theory.
Figure 3C:
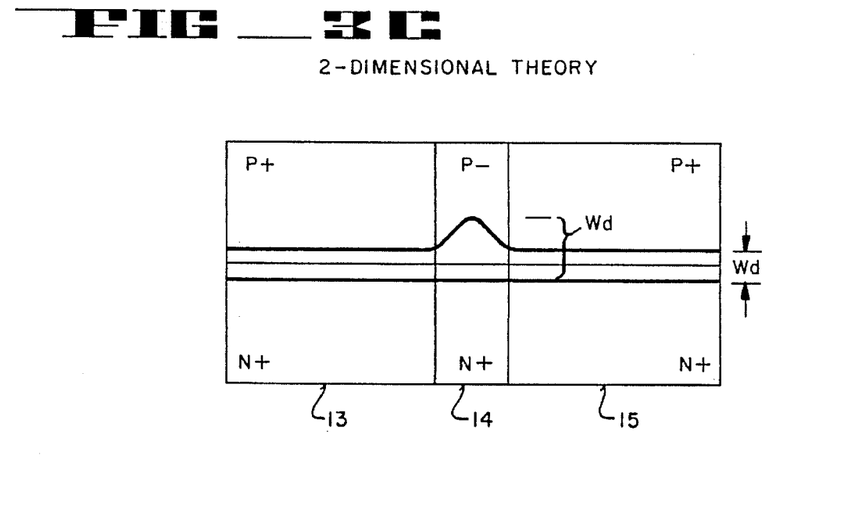
FIG. 3C shows the depletion region for a tree layer semiconductor structure having high-low-high lateral doping profile in the p-type material. Note that the depletion layers are illustrated for two-dimensional theory in FIG. 3C.

A slightly more complex case is illustrated in FIGS. 3A–3C. Here, a thin, lightly-doped PN junction is shown sandwiched between two wider, more heavily-doped PN junctions. The heavily-doped samples are shown by regions 13 and 15, while the thin, lightly-doped sample is shown as region 14. As before, the one-dimensional theory is incapable of accounting for the change in depletion layer width which occurs at the transition regions between the lightly-doped and more heavily-doped samples. The two-dimensional result, however, of FIG. 3B illustrates an important new effect.

Note that in FIG. 3B the depletion layer width in the lightly-doped sample 14 does not extend as far into the p– and n– regions as predicted by the one-dimensional theory. It is determined that if the thickness of region 14 is small enough (e.g., on the order of about 0.1 microns wide) the depletion region in this narrow sample will be constrained from extending to the full one-dimensional width. The amount that the depletion region is reduced is illustrated as $\Delta W_d$ in FIG. 3B.

The phenomena whereby the depletion width is constrained in a thin, narrow, lightly-doped sample surrounded by wider, more heavily-doped samples, is a key concept of the present invention. Note that this effect is not limited to the particular structure shown in FIG. 3B. The same effect can be achieved utilizing a thin, sample wherein only one side of the PN junction is lightly-doped. This situation is shown in FIG. 3C. In FIG. 3C, one side of the PN junction in region 14 is heavily doped (e.g., n+), while the other side is lightly-doped (e.g., p–). In other words, the acceptor side of the junction has a lateral profile which changes abruptly in central region 14.

In the structure of FIG. 3C, the depletion region on the donor (n-type) side of the junction is minimally affected since the doping concentration is largely uniform across regions 13, 14 and 15. On the other hand, depletion region on acceptor (p-type) side varies across region 14. The significance of all of this is that by constructing a similar p+/p–/p+ lateral doping profile in the base of a bipolar junction transistor, it is possible to reduce punch-through in a thin, lightly-doped base region, while simultaneously maintaining high beta. That is, the crux of the present invention involves tailoring the lateral doping profile across the base region to accomplish the previously unattainable goal of high beta and high punch-through voltage in a, high-performance, homojunction bipolar transistor.

Figure 4A:
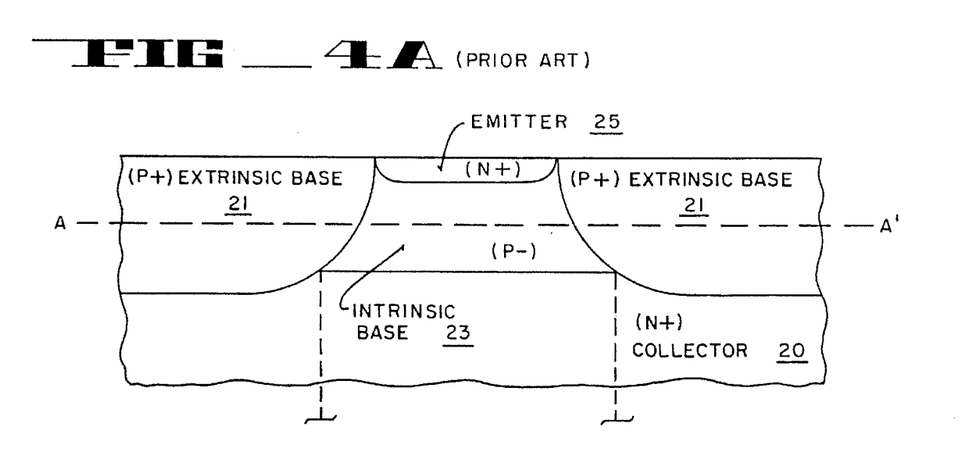
FIG. 4A illustrates a cross sectional elevation view of a conventional bipolar junction transistor structure.

With reference now to FIG. 4A, a cross-sectional elevation view of a prior art bipolar transistor is shown. The transistor of FIG. 4A includes a collector region 20 formed in a semiconductor substrate. The collector region is typically doped heavily N-type. Directly above the n+ collector region is a base region comprising extrinsic base regions 21 and intrinsic base region 23. The extrinsic regions are heavily-doped with p-type dopant to lower the base resistance of the device. In contrast, the intrinsic base region 23 (located directly beneath n+ emitter 25) is lightly-doped to provide high forward current gain. The fundamental operating principles of the bipolar transistor of FIG. 4A are well understood and therefore will not be discussed in detail in this application.

Figure 4B:
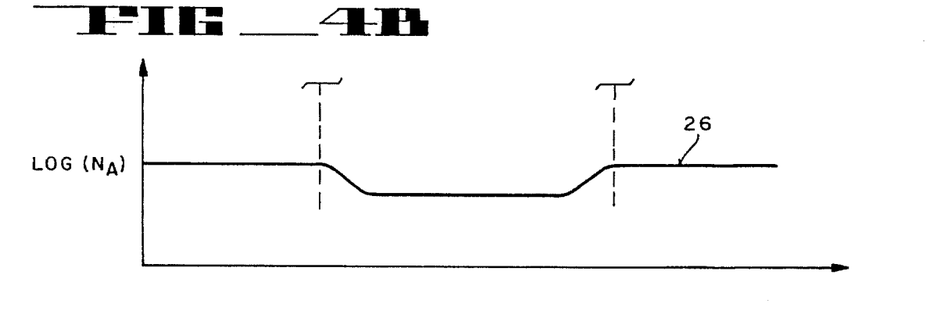
FIG. 4B illustrates the lateral doping profile of the transistor FIG. 4A as taken through pipelines A–A'.

FIG. 4B is a plot of the doping concentration $N_A$ across the lateral dimension of the transistor of FIG. 4A through the base region. Line 26 represents the lateral doping profile as taken through cut lines A–A'. Note that the different doping concentration of the intrinsic versus the extrinsic base regions is reflected in the relatively lower doping concentration level within intrinsic base region 23.

Figure 4C:
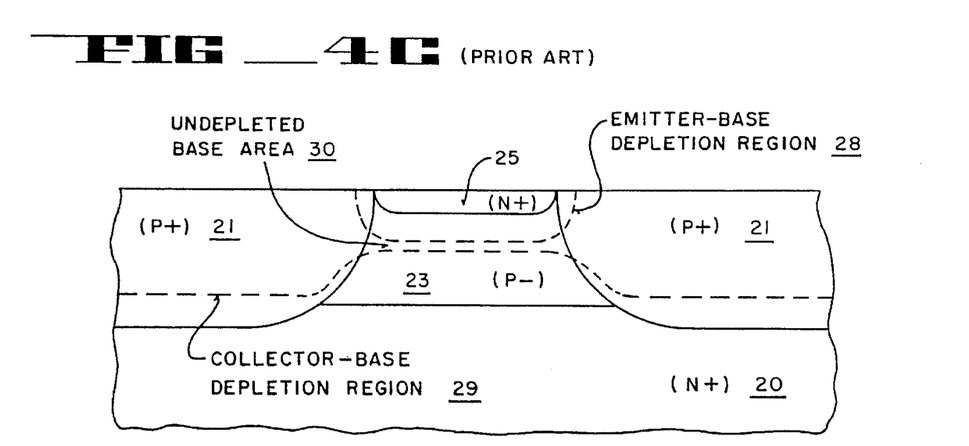
FIG. 4C illustrates the collector and emitter depletion region generated within the prior art bipolar transistor of FIG. 4A.

FIG. 4C illustrates the bipolar junction transistor of FIG. 4A including dash lines 28 and 29 which represent the extent of the emitter and collector depletion regions, respectively, into base regions 21 and 23. Note that the extension of these depletion regions into the base region 23 leaves only a narrow undepleted intrinsic base area 30. Although a narrow base is desirable for purposes of providing high beta and high speed, any increase in the collector-base voltage will cause depletion region 29 to further extend into base region 23 until it eventually meets depletion region 28. Thus, the penalty for having the high beta BJT shown in FIG. 4A–4C, is that the punch-through voltage is unfavorably low. On the other hand, widening the undepleted base area 30 or increasing its doping raises punch-through voltage but only at the expense of lower beta and slower speed.

Figure 5A:
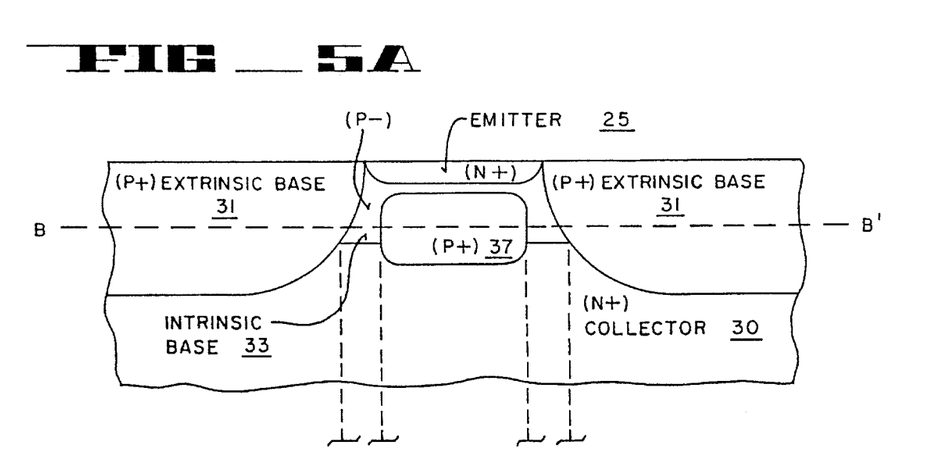
FIG. 5A illustrates a cross sectional elevation view of the present invention.
Figure 5B:
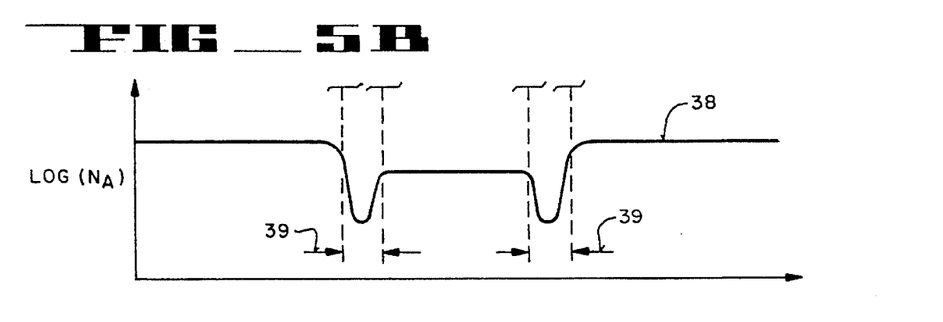
FIG. 5B is a plot of the lateral doping concentration in the base region of the structure of FIG. 5A as taken through cut lines B–B'.
Figure 5C:
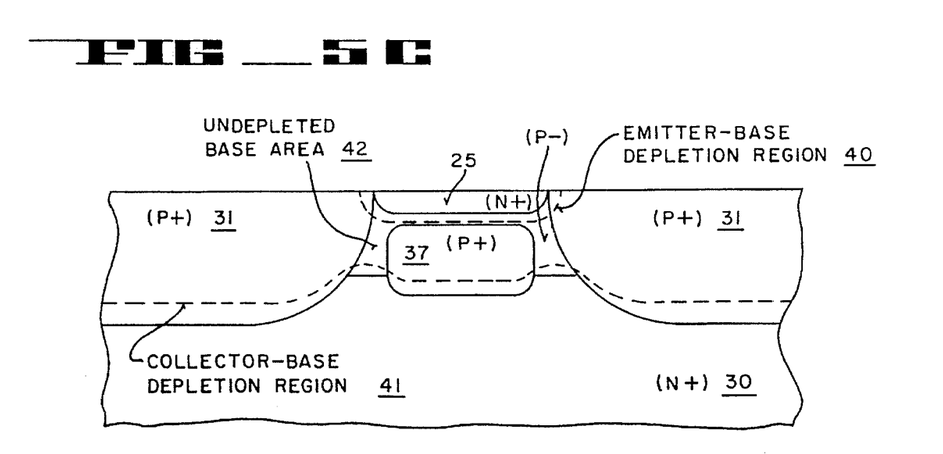
FIG. 5C illustrates the collector and emitter depletion regions for the present invention.

The device structure of the present invention is illustrated in FIGS. 5A–5C. The most notable difference between the present invention and the prior art structure is the presence of a heavily-doped central intrinsic base region 37. Central base region 37 is separated from the extrinsic base 31 by a relatively lightly-doped intrinsic base region 33. Intrinsic base region 33 and central base region 37 are both disposed generally beneath emitter 25. At the same time, extrinsic base region 31, intrinsic base region 33 and central base region 37 are all disposed above collector region 30.

In the currently preferred embodiment, emitter region 25 is on the order of 0.2 to 0.3 microns wide, and is formed to a depth of about 0.05 microns. The nominal base width is about 0.1 microns. Extrinsic p+ base regions 31 are again included to reduce base resistance. Regions 31 are typically formed by diffusion of dopants into the silicon substrate. In the current embodiment, p+ extrinsic base regions 31 are ion implanted to a concentration of approximately $3.0 \times 10^{15}$ atoms/cm$^2$.

The intrinsic base region 33 is also typically formed by ion implantation through a masking layer. Preferably, base region 33 is implanted to a concentration of approximately $5.0 \times 10^{13}$ atoms/cm$^2$.

A primary characteristic of the present invention is that the lateral doping profile across the base region is highly altered as compared to the standard BJT. Preferably, the dose (and hence the total charge $Q_b$) in the intrinsic base is reduced to about five times less than normal. A second base implant step is then performed through a masking layer positioned over the center of intrinsic base region 33 to produce the localized, heavily-doped p+ region 37. Note that the implant for region 37 is normally performed prior to formation of emitter 35. In the currently preferred embodiment, the masking layer used to form emitter 35 is also be for implantation of region 37.

Localized p+ region 37 is preferably doped to about twice the standard intrinsic base charge level. After implantation of region 37, the device may optionally be subjected to an annealing cycle prior to implantation or diffusion of emitter 35. It is appreciated that there are numerous ways of fabricating the structure FIG. 5A, the present invention may be realized employing a wide range of fabrication and processing techniques. Therefore, the present invention is not limited to the particular embodiments described.

The essential feature illustrated in FIG. 5A is that including of central region 37 to radically alter the lateral doping profile of the base region. Specifically, inclusion of region 37 creates very narrow spaces of lightly-doped intrinsic base regions while are surrounded by more heavily-doped extrinsic and central base regions. This basic structural improvement improves the punch-through voltage characteristics without adversely affecting beta.

FIG. 5B shows lateral doping profile for the transistor structure of FIG. 5A. Note that the doping concentration is significantly lower in the narrow spaces (p–) 39 which separate extrinsic base regions (p+) 31 from central base region (p+) 37. In central region 37, the doping concentration is indicated by line 38 and is shown to be much higher than that of intrinsic base regions 33. Although in the currently preferred embodiment, the doping concentration in region 37 is slightly less than that associated with extrinsic base regions 31, they may be doped to the same order of magnitude.

Because of the close spacing of the two P+ regions in the lateral base dimension, the situation shown in FIGS. 5A–C is akin to that represented in FIG. 3C. That is, because of the narrow spacing, the collector-base depletion region does not extend as far into the p– intrinsic base region 33 as it normally would given the relative doping concentrations. In other words, the depletion region is constrained by the high/low/high lateral doping profile of the base. Therefore is not allowed to reach full extension. This depletion condition is illustrated in FIG. 5C where the collector-base depletion region is shown by dash line 41, and the emitter-base depletion region is illustrated by dash line 40. Note that because the collector-base depletion region is constrained by the sandwiched doping profile, the undepleted base area 42 is significantly wider than in conventional homojunction bipolar structures. The structure of FIGS. 5A–5C basically utilizes the more heavily-doped central base region to effectively "pull" the collector depletion region back-analogous to the drawing of FIG. 3C. The invented transistor structure is now dominated by the narrow lightly-doped base regions near the edges of the emitter, i.e., spaces 39. Due to the effect of the nearby p+ regions on either side of spaces 39, the punch-through current is greatly reduced. Due to the lighter doping in the small emitterbase spaces 39, the barrier height of the pn junction is reduced in this area relative to regions 37 and 31. The forward beta is then dominated by these small, lightly-doped regions and is significantly increased.

It should be understood that constraining the depletion region in the manner described above is unrelated to the classical emitter edge effect caused by a voltage drop induced by the flow of base current laterally to the high resistance pinched base. Rather, the dramatic reductions in punch-through current and simultaneous increase in beta are confirmed to be the result of limiting the extension of the collector-base depletion region by means of a heavily-doped/slightly-doped/heavily-doped laterally based profile under the emitter. In the currently preferred embodiment, this spacing is extremely small—on the order of about 0.05 microns wide.

Additionally, because of the overall increase in gain, the maximum operating frequency (e.g., $F_t$) is also significantly improved. By way of example, a modern, state-of-the-art silicon homojunction bipolar transistor commonly has a maximum beta of about 100 for punch-through currents of approximately 1 nanoampere for a 3 volts collector voltage. A typical $F_t$ for this device is on the order of 40 GHz In contrast, a device fabricated in accordance with the present invention exhibits a beta of approximately 500, a punch-through current of about 1 picoampere at 3 volts, and an $F_t$ of nearly 55 GHz. Moreover, base resistance and base-collector capacitance is about the same as in previous structures. Because of the smaller potential barrier in lightly-doped regions where the majority of emitter current is injected under forward bias, the turn-on voltage, i.e., $V_{be}$, Of the invented bipolar transistor is also slightly decreased.

Another significant advantage of the present invention is that the bipolar transistor of FIG. 5A–5C is able to perform equally well with 5 volts on the collector. At 5 volts, across the collector emitter, the $F_t$ of the device rises to about 60 GHz with a punch-through current of only 1 nanoampere. The frequency characteristics of the transistor can be further improved by the addition of a narrow spike in the buried layer directly under the emitter. This provides a means of reducing collector transit time without significantly increasing the base-collector capacitance.

Besides improving the performance of existing bipolar transistors, the present invention promises to significantly extend the scaleability of future BJTs. Using this technique, for example, a transistor can be scaled much more aggressively without having to reduce power supply voltage accordingly. Thus, the present invention facilitates compatibility with standard supply voltages while maintaining system cost as low as possible.

Although the present invention embodies the concept of controlling depletion regions to specifically improve the performance of a high speed bipolar transistor, this technique may also be applied more generally to other applications. In other words, the formation of narrow, lightly-doped spaces surrounded by more heavily-doped areas which reduced the extent of the associated depletion region in the lightly-doped area will no doubt prove useful in other semiconductor device structures. For example, the same concept may be used to improve the performance of pnp devices in a structure similar to that described, but with the conductivity types reversed. In either case, however, it is worth noting that the spacings should to be on the order of 0.10 microns (or smaller) wide to provide effective reduction in the extent of the depletion width.

In addition, the specific technique of forming a base doping profile that is tailored in the manner described above, represents only one of many processing methods which may be used. Other embodiments might form lightly-doped narrow spaces surrounded by a more heavily-doped areas by means of small holes or slots disposed in a continuous sheet of more heavily-doped material. Such alternatives are considered to be well within the spirit and scope of the present invention.

Figure 6A:
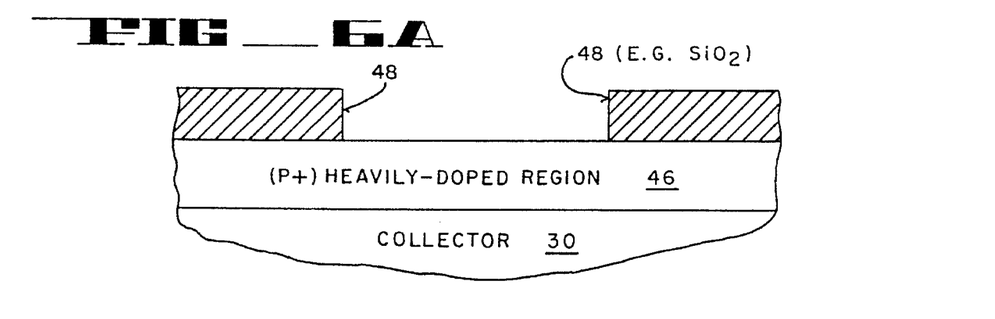
FIGS. 6A–6D are cross sectional elevation views illustrating one method of fabricating the device structure of FIG. 5A.

FIGS. 6A–6D illustrate one alternative method of fabricating the structure of the present invention. For example, FIG. 6A illustrates a collector region 30 formed using conventional processing techniques. A heavily-doped p+ region 46 is formed directly above collector region 30. Region 46 is typically formed by diffusion or ion implantation. A masking layer 48 is then patterned to form an opening over the heavily-doped p-type region 46. (An example of a refractory masking layer which may used for layer 48 is silicon dioxide).

Figure 6B:
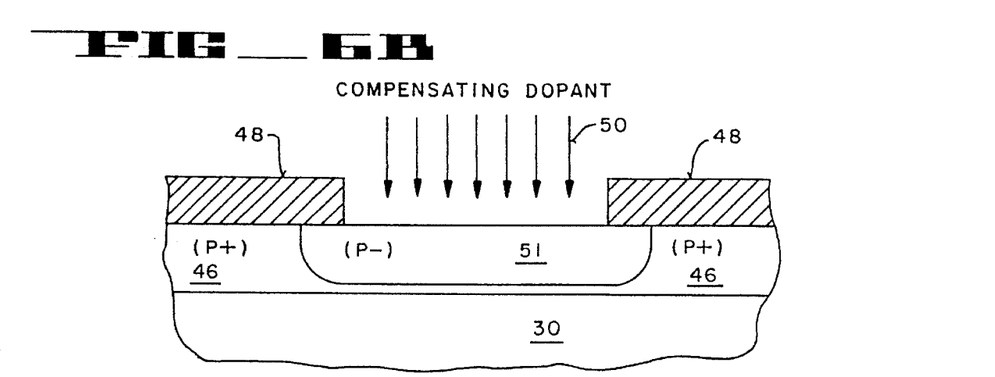

Following the patterning of masking layer 48, a compensating dopant is then introduced into the substrate to form a lightly-doped p– region 51. This is indicated in FIG. 6B by arrows 50. Of course, the compensating dopant may be introduced either by diffusion or by ion implantation. The dopant is then diffused laterally to form a compensated region 51 that is slightly larger than the opening of masking layer 48. Alternatively, the compensating dopant may be ion implanted at an angle, or lateral implant scattering may be relied upon to produce the slightly larger lateral dimension of region 51.

Figure 6C:
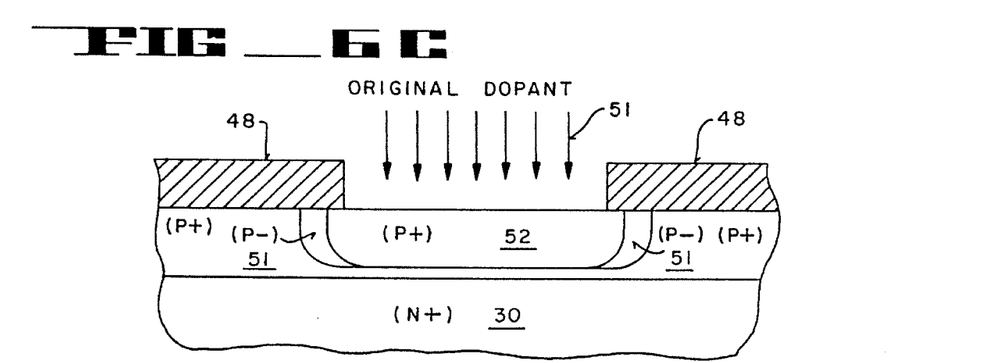

Without removing refractory masking layer 48, an additional dopant is then implanted or diffused into the silicon substrate. This is shown in FIG. 6C by arrows 51. Typically, the dopant used to form region 46 would be the same as used to form region 52. That is, the doping concentrations in regions 52 and 46 are nearly the same. It is important, however, that the lateral diffusion or extent of region 52 be less than that associated with region 51. This ensures that narrow, lightly-doped regions 51 will be formed around the periphery of region 52. It is appreciated that region 52 forms the highly-doped central intrinsic base region for the BJT.

Figure 6D:
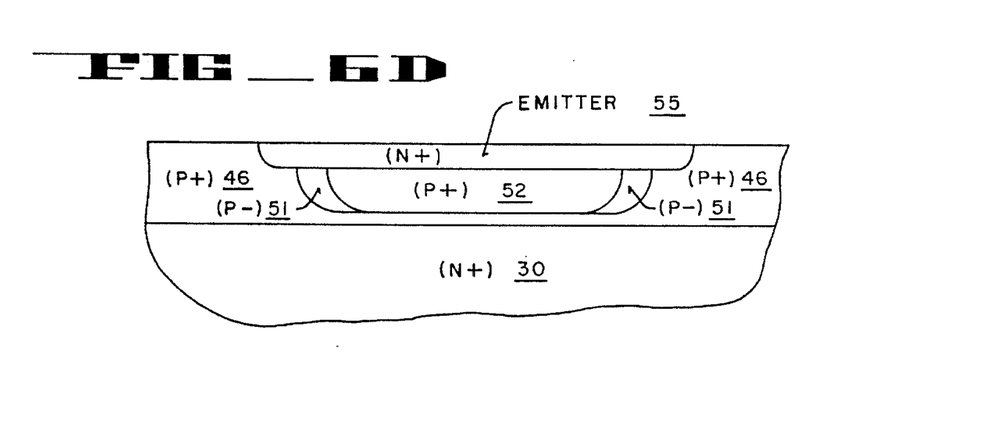

Following the completion of the base region, masking layer 48 is removed and emitter 55 is formed using conventional photolithographic techniques. Practitioners in the art will appreciate that the above method has certain advantages over the earlier described process in that it relies upon very controllable diffusion or implant processes to form the small required spaces 51.

Although the present invention has been described in conjunction with certain embodiments, it is appreciated that the invention may be implemented in a variety of other ways. For instance, a pnp transistor having similar improved characteristics could be realized in accordance with the present invention by reversing the p-type and n-type regions. Consequently, it is to be understood that the particular embodiments shown and described by way of illustration are in no way intended to be considered limiting. References to the details of these embodiments is not intended to limit the scope of the claims which themselves recite only those features regarded as essential to the invention.

I claim:

1. A method of fabricating a bipolar junction transistor in a silicon substrate comprising the steps of:

forming a collector region in said substrate;

forming extrinsic and intrinsic base regions, said extrinsic region being more heavily doped than said intrinsic region;

introducing a dopant into said intrinsic region to form a heavily doped central area separated from said extrinsic region by a more lightly doped side area in which the lateral dimension of said side area between said extrinsic region and said central area is no greater than about 0.10 micron;

forming an emitter region disposed generally above said central area of said intrinsic base region and surrounded laterally by said extrinsic base region.

2. The method of claim 1 wherein said side area is approximately 0.05 microns wide.

3. The method of claim 1 wherein said introducing step comprises the steps of:

forming an opening in a masking layer over said intrinsic region; and implanting a p-type dopant into said intrinsic region.

4. The method of claim 3 wherein said step of forming said emitter region comprises the step of implanting an n-type dopant through said opening.

5. The method of claim 4 wherein said step of forming said emitter region comprises the step of diffusing an n-type dopant through said opening.

6. A method of fabricating a bipolar junction transistor exhibiting improved beta and punch-through characteristics comprising the steps of:

providing a substrate;

forming a collector region in said substrate;

heavily doping a base region disposed above said collector region utilizing a first dopant;

patterning a masking layer to provide an opening over said base region;

introducing a compensating dopant into said base region through said opening;

introducing a second dopant into said base region to form a heavily doped area, the lateral diffusion of said second dopant being less than the lateral diffusion of said compensating dopant so as to form a relatively lightly-doped area surrounded by more heavily-doped areas within said base region, in which the lateral dimension of the lightly-doped area between the more heavily-doped areas is no greater than about 0.10 micron;

forming an emitter region over said base region, said emitter region extending laterally at least as far as said lightly-doped areas.

7. The method of claim 6 wherein said first and second dopants are a p-type, and wherein said compensating dopant is n-type.

8. The method of claim 7 wherein said patterning step comprises the steps of:

depositing a refractory masking layer over said substrate; and patterning said masking layer to form said opening.

9. The method of claim 8 wherein said refractory masking layer comprises silicon dioxide.

10. The method of claim 9 wherein said second dopant is introduced into said base region through said opening.

11. The method of claim 10 wherein said compensating dopant is introduced into said base region by ion implantation.

12. The method of claim 11 wherein said emitter region is formed by a diffusion through another masking layer.

* * * * *